United States Patent
Taniguchi (10) Patent No.: US 10,998,257 B2
(45) Date of Patent: May 4, 2021

(54) SEMICONDUCTOR DEVICE AND METHOD OF MANUFACTURING SAME

(71) Applicants: Kabushiki Kaisha Toshiba, Minato-ku (JP); Toshiba Electronic Devices & Storage Corporation, Minato-ku (JP)

(72) Inventor: Tomohiro Taniguchi, Nomi (JP)

(73) Assignees: Kabushiki Kaisha Toshiba, Minato-ku (JP); Toshiba Electronic Devices & Storage Corporation, Minato-ku (JP)

(*) Notice: Subject to any disclaimer, the term of this patent is extended or adjusted under 35 U.S.C. 154(b) by 0 days.

(21) Appl. No.: 16/540,159

(22) Filed: Aug. 14, 2019

(65) Prior Publication Data
US 2020/0294897 A1    Sep. 17, 2020

(30) Foreign Application Priority Data
Mar. 11, 2019   (JP) .............................. JP2019-044019

(51) Int. Cl.
  *H01L 23/498*  (2006.01)
  *H01L 23/00*  (2006.01)
  *H01L 21/48*  (2006.01)

(52) U.S. Cl.
  CPC .... *H01L 23/49811* (2013.01); *H01L 21/4821* (2013.01); *H01L 24/17* (2013.01); *H01L 2924/01028* (2013.01); *H01L 2924/01029* (2013.01); *H01L 2924/01046* (2013.01); *H01L 2924/01079* (2013.01)

(58) Field of Classification Search
  CPC . H01L 2924/01079; H01L 2924/01046; H01L 2924/1305; H01L 2224/05155; H01L 2924/01028; H01L 24/17; H01L 23/49811; H01L 23/3171; H01L 21/4821; H01L 2924/01029
  See application file for complete search history.

(56) References Cited

U.S. PATENT DOCUMENTS

| 6,686,660 B2 | 2/2004 | Nemoto |
| 2020/0227380 A1* | 7/2020 | Kadoguchi ............. H01L 24/83 |

FOREIGN PATENT DOCUMENTS

| JP | 2003-338516 A | 11/2003 |
| JP | 2010-263137 A | 11/2010 |
| WO | WO 2015/107796 A1 | 3/2017 |

\* cited by examiner

*Primary Examiner* — Jasmine J Clark
(74) *Attorney, Agent, or Firm* — Oblon, McClelland, Maier & Neustadt, L.L.P.

(57) ABSTRACT

A semiconductor device includes a semiconductor body; an electrode provided on the semiconductor body and electrically connected to the semiconductor body; a first metal layer selectively provided on the electrode; an insulating layer surrounding the first metal layer on the electrode; and a second metal layer provided on the first metal layer. The insulating layer includes a first surface and a second surface adjacent to the first surface. The first surface contacts a top surface of the first metal layer at an outer edge of the first metal layer. The second metal layer has an outer edge contacting the second surface of the insulating layer.

17 Claims, 7 Drawing Sheets

SEMICONDUCTOR DEVICE AND METHOD OF MANUFACTURING SAME

CROSS-REFERENCE TO RELATED APPLICATIONS

This application is based upon and claims the benefit of priority from Japanese Patent Application No. 2019-044019, filed on Mar. 11, 2019; the entire contents of which are incorporated herein by reference.

FIELD

Embodiments described herein relate generally to a semiconductor device and a method of manufacturing the same.

BACKGROUND

A semiconductor device used for high power control is connected to a power supply circuit through a plate-like connection conductor such as a connector or a bus bar. Thus, it is necessary to insert a bonding member between an electrode on the semiconductor and the connection conductor.

BRIEF DESCRIPTION OF THE DRAWINGS

FIGS. 3A to 4B are schematic cross sectional views showing manufacturing processes of the semiconductor element according to the embodiment;

DETAILED DESCRIPTION

According to one embodiment, a semiconductor device includes a semiconductor body; an electrode provided on the semiconductor body and electrically connected to the semiconductor body; a first metal layer selectively provided on the electrode; an insulating layer surrounding the first metal layer on the electrode; and a second metal layer provided on the first metal layer. The insulating layer includes a first surface and a second surface adjacent to the first surface. The first surface contacts a top surface of the first metal layer at an outer edge of the first metal layer. The second metal layer has an outer edge contacting the second surface of the insulating layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
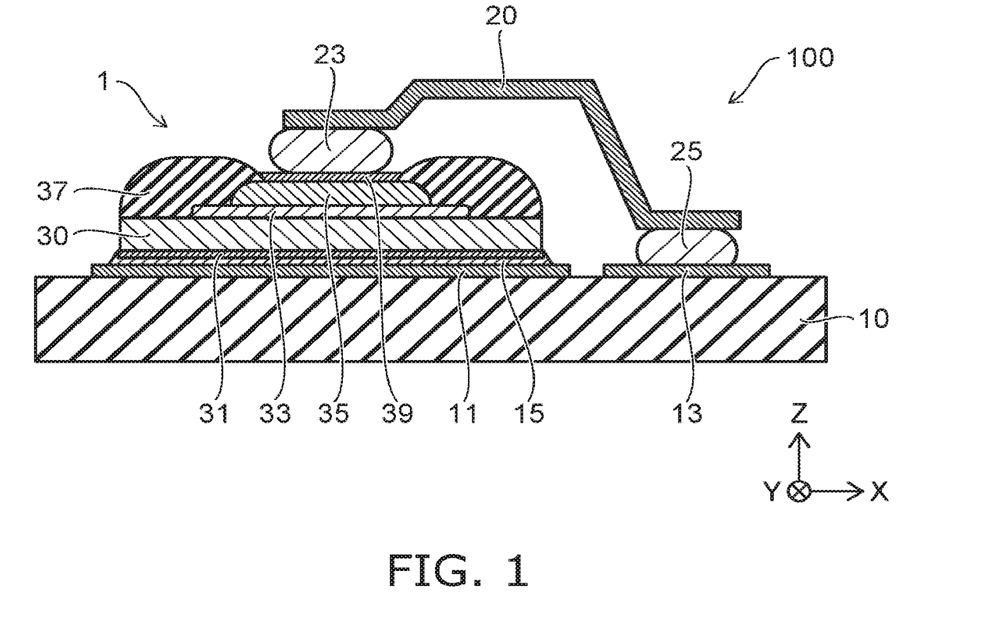
FIG. 1 is a schematic cross sectional view showing a semiconductor device according to an embodiment.

FIG. 1 is a schematic cross sectional view showing a semiconductor device 100 according to an embodiment. The semiconductor device 100 includes, for example, a semiconductor element 1, a circuit board 10, and a connection conductor 20.

As shown in FIG. 1, the circuit board 10 includes a mounting pad 11 and an interconnection 13. The mounting pad 11 is provided on a surface of the circuit board 10. The semiconductor element 1 is mounted on the mounting pad 11 via a bonding member 15. The semiconductor element 1 is electrically connected to the interconnection 13 via the connection conductor 20.

The semiconductor element 1 includes a semiconductor body 30, an electrode 31, an electrode 33, a metal layer 35, an insulating layer 37, and a metal layer 39. The semiconductor element 1 is, for example, an IGBT (Insulated Gate Bipolar Transistor). The electrode 31 is, for example, a collector electrode, and the electrode 33 is, for example, an emitter electrode. The semiconductor body 30 is, for example, silicon.

The electrode 31 is provided on a back surface of the semiconductor body 30. The electrode 33 is provided on a front surface of the semiconductor body 30. The metal layer 35 is selectively provided on the electrode 33. The insulating layer 37 is provided so as to surround the metal layer 35 on the electrode 33. The metal layer 39 is provided on the metal layer 35.

The connection conductor 20 is, for example, a copper plate, and is bonded on the metal layer 39 via a bonding member 23. The connection conductor 20 is bonded on the interconnection 13 via a bonding member 25. The bonding members 23 and 25 are, for example, solders.

The semiconductor device 100 is not limited to the above example. For example, the semiconductor element 1 may be a MOSFET or a diode. The circuit board 10 may be replaced with a copper frame, for example.

Figure 2:
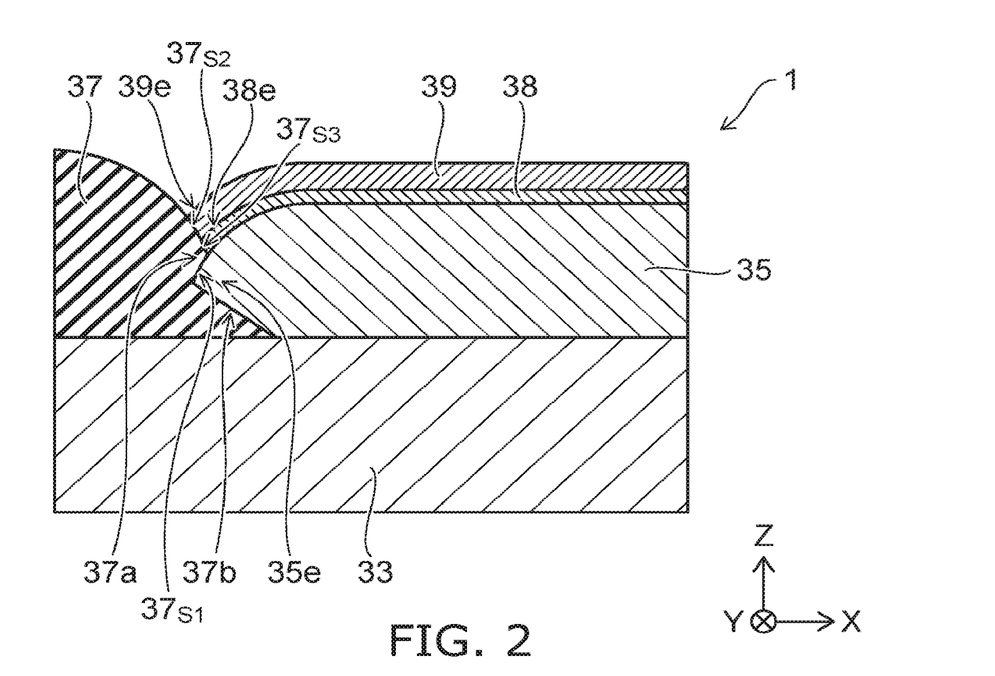
FIG. 2 is a schematic cross sectional view showing an electrode structure of a semiconductor element according to the embodiment.

FIG. 2 is a schematic cross sectional view showing an electrode structure of the semiconductor element 1 according to the embodiment. The semiconductor element 1 includes, for example, the metal layer 35, a metal layer 38 and the metal layer 39 stacked on the electrode 33. The electrode 33 is, for example, an aluminum electrode. A material of the electrode 33 may be a metal including copper. The metal layer 35 is, for example, a nickel layer.

The metal layer 38 is, for example, a palladium layer. The metal layer 39 is, for example, a gold (Au) layer.

The metal layer 39 is provided to improve a bonding strength of the connection conductor 20 via the bonding member 23. For example, adhesion strength between the bonding member 23 and the metal layer 39 (see FIG. 1) is larger than the adhesion strength of the bonding member 23 in the case where the bonding member 23 is placed so as to directly contact the metal layer 35. The metal layer 38 is provided, for example, to prevent the adhesion strength between the bonding member 23 and the metal layer 39 from being decreased by the metal atoms of the metal layer 35 diffused by heat into the metal layer 39 when mounting. That is, the metal layer 38 is a so-called barrier layer. When the metal layer 39 is formed with a thickness of 0.1 μm or more, for example, the metal layer 38 may be omitted.

As shown in FIG. 2, the metal layer 35 is provided so that the outer edge 35e is along the inner surface of the insulating layer 37. The metal layer 38 and the metal layer 39 also are provided such that the outer edge 38e and the outer edge 39e are along the insulating layer 37.

For example, in a direction (Z-direction) perpendicular to a surface of the electrode 33, the insulating layer 37 has a thickness thicker than the total thickness of the metal layer 35, the metal layer 38 and the metal layer 39. The insulating layer 37 includes a first extending portion 37a and a second extending portion 37b.

The first extending portion 37a is positioned between the outer edge 35e of the metal layer 35 and the outer edge 38e of the metal layer 38, in the Z-direction. The first extending portion 37a is positioned between the outer edge 35e of the metal layer 35 and the outer edge 39e of the metal layer 39, in the Z-direction. The second extending portion 37b is positioned between the electrode 33 and the outer edge 35e of the metal layer 35, in the Z-direction.

The insulating layer 37 includes a surface $37_{S1}$ contacting the top surface of the metal layer 35 at the outer edge 35e, a surface $37_{S2}$ contacting the outer edge 39e of the metal layer 39, and a surface $37_{S3}$ contacting the outer edge 38e of the metal layer 38. The surface $37_{S3}$ is positioned between the surface $37_{S2}$ and the surface $37_{S1}$.

A method of forming the electrode structure shown in FIG. 2 will be described herein with reference to FIGS. 3A to 4B. FIGS. 3A to 4B are schematic cross sectional views showing in order the manufacturing processes of the semiconductor element 1 according to the embodiment.

Figure 3A:
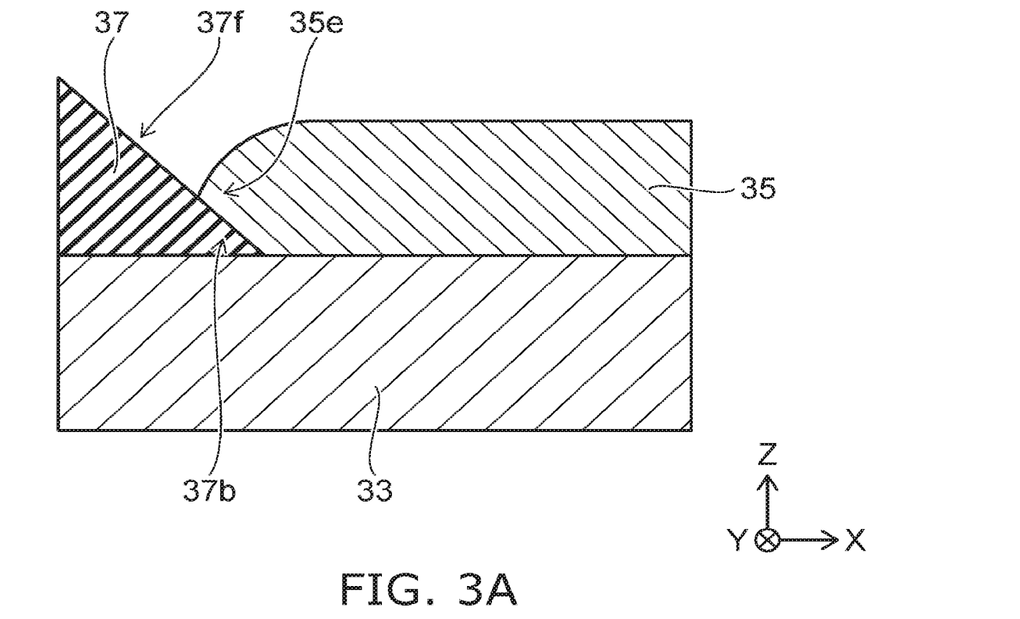

As shown in FIG. 3A, a metal layer 35 and an insulating layer 37 are formed on the electrode 33. The insulating layer 37 has an opening 37f so as to expose the electrode 33. The metal layer 35 is formed, for example, by electroless plating with a metal including nickel as a main component. The metal layer 35 is selectively formed on the electrode 33 using the insulating layer 37 as a mask. The metal layer 35 is formed so as to contact the inner surface of the insulating layer 37. The metal layer 35 may include a material such as a nickel phosphorous alloy, a nickel boron alloy, or nickel cobalt tungsten phosphorus alloy or the like. The metal layer 35 may include a material including copper as a main component.

The insulating layer 37 includes the insulating material having a glass transition point. The insulating layer 37 includes, for example, siloxane, and is formed on the electrode 33 using a spin coating method. The opening 37f is, for example, formed by selectively etching the insulating layer 37 using an etching mask (not shown) formed by photolithography. The insulating layer 37 may be formed, for example, by a screen printing or the like.

The opening 37f of the insulating layer 37 is formed so as to have the opening width being widened upwards from the surface of the electrode 33. Thus, the outer edge 35e of the metal layer 35 is formed so as to broaden over the edge of the insulating layer 37. That is, the insulating layer 37 is formed so as to have the second extending portion 37b positioned between the electrode 33 and the outer edge 35e of the metal layer 35.

Figure 3B:
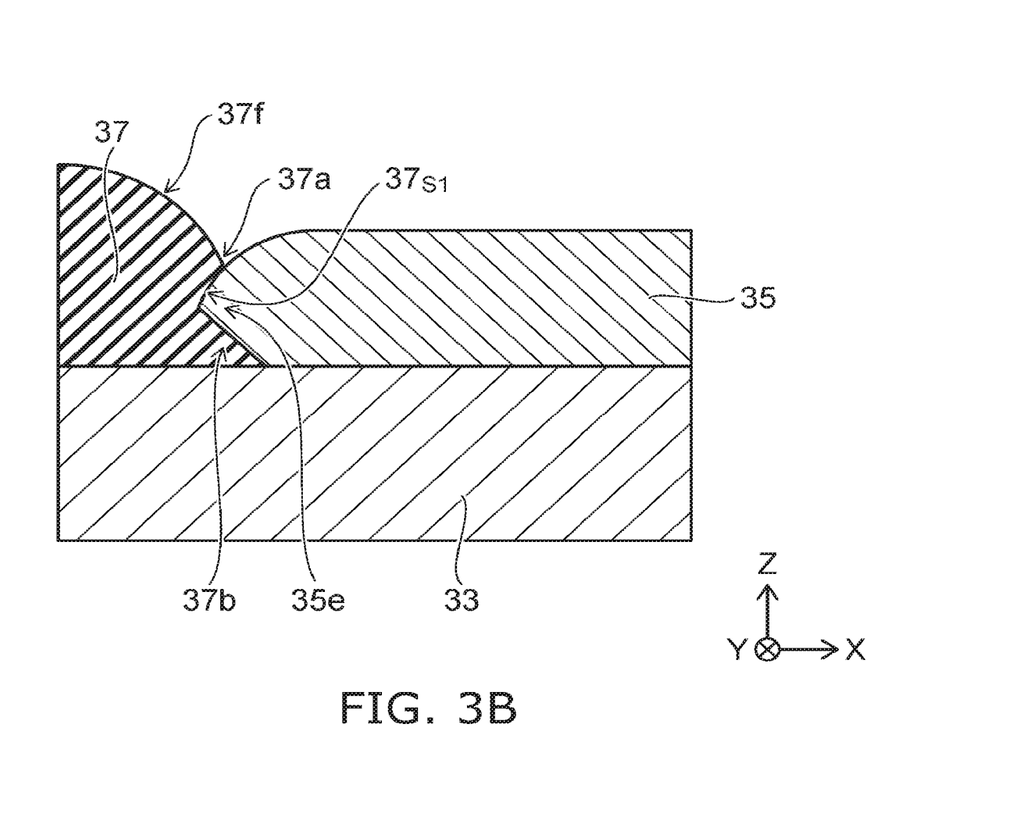

As shown in FIG. 3B, the insulating layer 37 is deformed to cover the outer edge 35e of the metal layer 35. The insulating layer 37 is heated to a temperature higher than the glass transition temperature. Such as a reflow method is used for heating the insulating layer 37. Thereby, the first extending portion 37a of the insulating layer 37 is formed on the outer edge 35e of the metal layer 35. The insulating layer 37 is formed to have the surface $37_{S1}$ contacting the top surface the metal layer 35 at the outer edge 35e.

The insulating material used for the insulating layer 37 preferably has the glass transition temperature in a temperature range of 120° C. to 350° C. When the glass transition temperature is less than 120° C., for example, the insulating layer 37 may be deformed by heat in the lithography process through which the opening 37f is formed. It may also be difficult to avoid further heat deformation of the insulating layer 37 in a process after the reflow such as a wafer drying process. On the other hand, when nickel is used for the metal layer 35, crystallization accompanying phase transition occurs at a temperature higher than 350° C. In order to avoid the deformation or transformation by heat, it is desirable for the insulating layer 37 to be deformed by heat in the temperature range of not less than 120° C. and not more than 350° C.

Figure 4A:
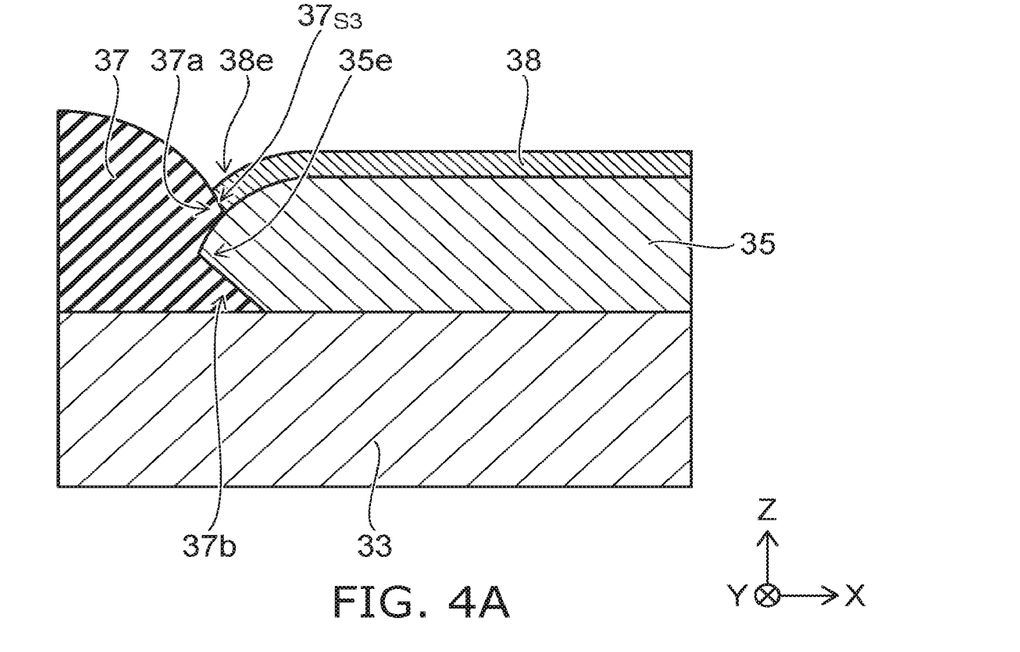

As shown in FIG. 4A, the metal layer 38 is formed on the metal layer 35. The metal layer 38 is selectively formed, for example, by using electroless plating. The metal layer 38 is, for example, a palladium layer. A material of the metal layer 38 may be a metal including gold, nickel, tungsten, or phosphorous or the like. The outer edge 38e of the metal layer 38 contacts the first extending portion 37a of the insulating layer 37. The insulating layer 37 has the surface $37_{S3}$ contacting the outer edge 38e of the metal layer 38.

Figure 4B:
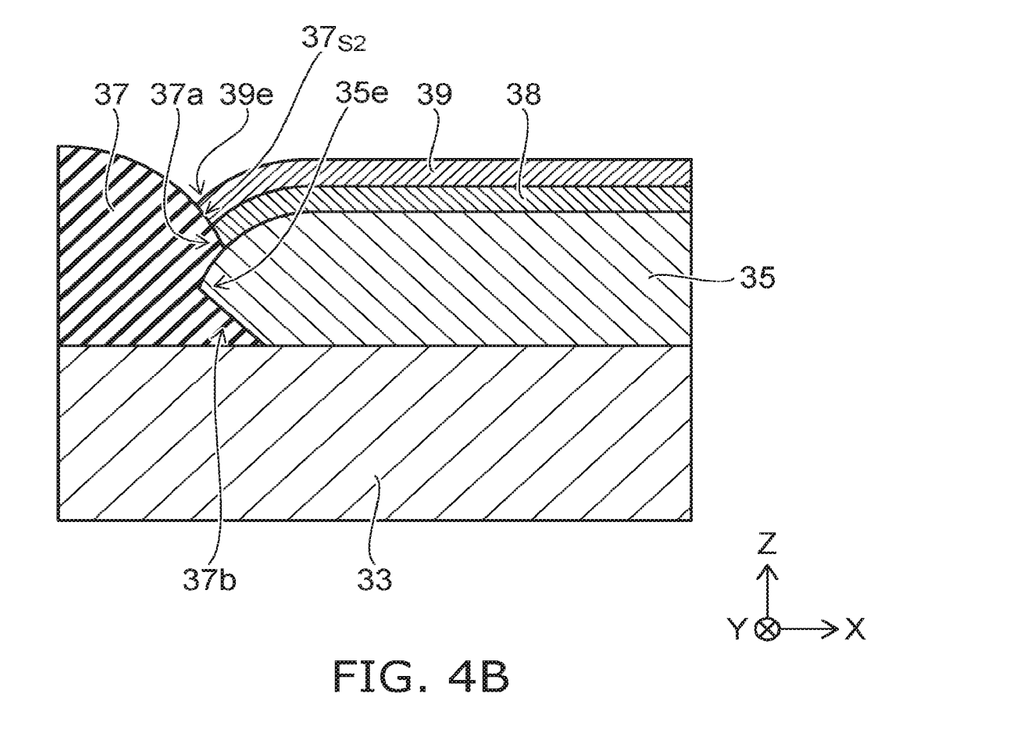

As shown in FIG. 4B, the metal layer 39 is formed on the metal layer 38. The metal layer 39 is selectively formed, for example, using electroless plating. The metal layer 39 is, for example, a gold (Au) layer. A material of the metal layer 39 may be, for example, a metal including palladium. The outer edge 39e of the metal layer 39 contacts the first extending portion 37a of the insulating layer 37. The insulating layer 37 has the surface $37_{S2}$ contacting the outer edge 39e of the metal layer 39.

The manufacturing process described above is an example, and not limited thereto. For example, the metal layer 39 may be formed directly on the metal layer 35 without the metal layer 38.

Figure 5:
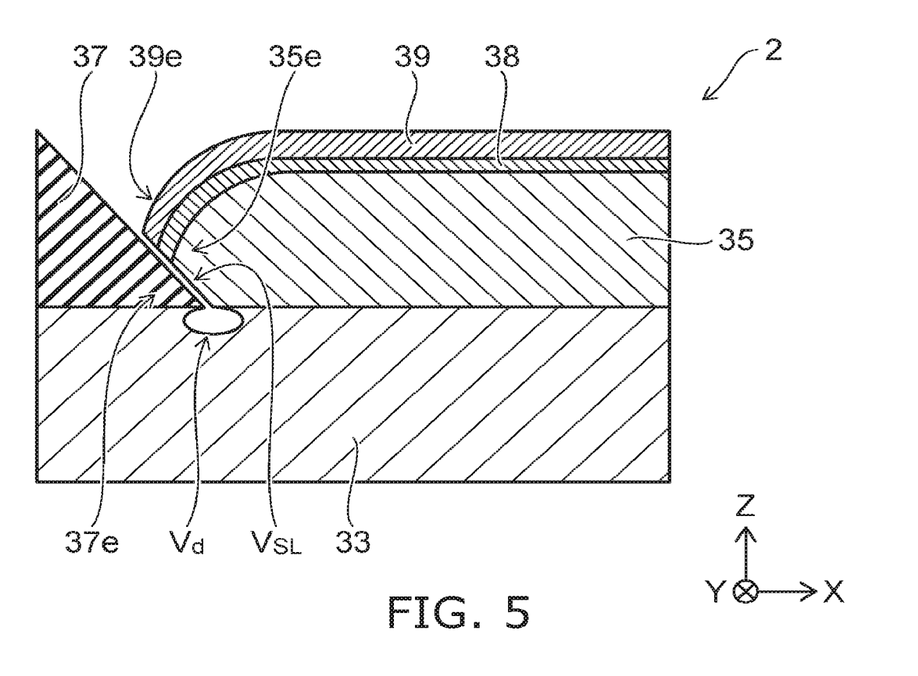
FIG. 5 is a schematic cross sectional view showing an electrode structure of a semiconductor element according to a comparative example.

FIG. 5 is a schematic cross sectional view showing an electrode structure of a semiconductor element 2 according to a comparative example. In a manufacturing process of the semiconductor element 2, the thermal treatment for deforming the insulating layer 37 is not performed. Thus, the metal layer 38 and the metal layer 39 are formed so as to be broadened along the edge 37e of the insulating layer 37 as well as the metal layer 35.

For example, gold plating solution used for forming the metal layer 39 reacts with the metal layer 35 including nickel, and corrodes or dissolves the metal layer 35. When the wafer is dipped in the plating solution to form the metal layer 39 after the metal layer 35 and the metal layer 38 are formed, the plating solution may penetrate along the interface between the insulating layer 37 and the metal layers 35 and 38, forming a gap $V_{SL}$ between the metal layer 35 and the insulating layer 37. Furthermore, when the metal layer 38 includes palladium, there may be a case where the nickel corrosion is facilitated due to the difficulty of electron exchange between the palladium and gold complex in the plating solution.

Accordingly, when expanding the period of dipping the wafer into the plating solution to make the metal layer 39 thicker, the gap $V_{SL}$ is broadened between the insulating layer 37 and the metal layer 35. Further, the plating solution reaches the electrode 33, and also corrodes the electrode 33. Thereby, a hollow Vd may be formed between the electrode 33 and the metal layer 35. As a result, there may be a case where the semiconductor device 100 has the electric characteristics and reliability degraded.

In contrast to this, in the semiconductor element 1 according to the embodiment, after the metal layer 35 is formed, the insulating layer 37 is heated and deformed to cover the top surface of the metal layer 35 at the outer edge 35e (see FIG. 2). Thereby, it is possible to prevent the plating solution from penetrating to the electrode 33 by increasing the distance along the surface of the insulating layer 37 from the top surface of the metal layer 38 at the outer edge 38e to the electrode 33. As a result, it is possible to improve the electric characteristics and reliability of the semiconductor 100.

Figure 6:
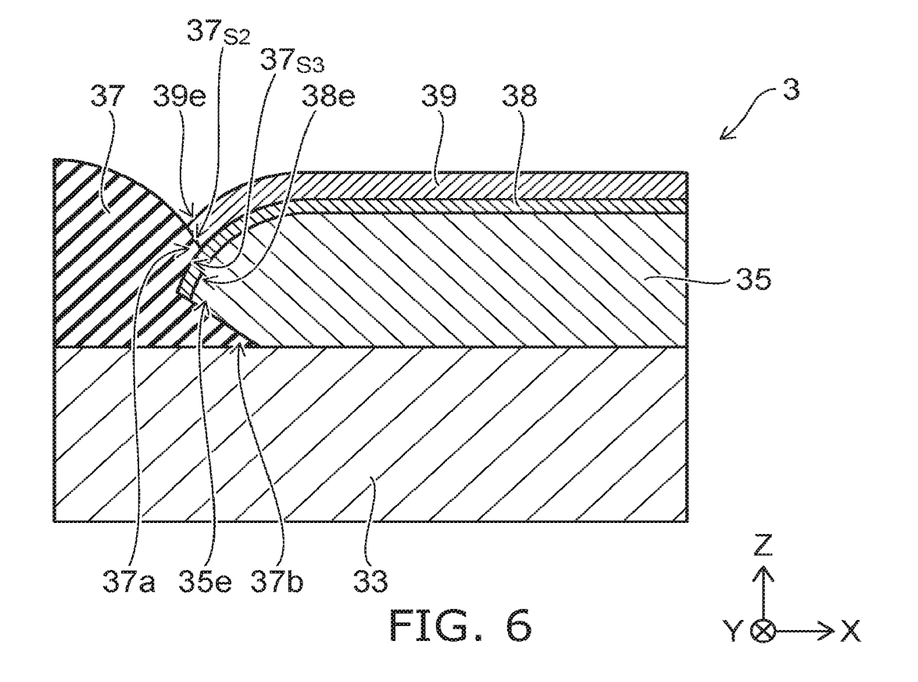
FIG. 6 is a schematic cross sectional view showing an electrode structure of a semiconductor element according to a first variation of the embodiment.

FIG. 6 is a schematic cross sectional view showing an electrode structure of a semiconductor element 3 according to a first variation of the embodiment. In this example, the first extending portion 37a of the insulating layer 37 is provided on the outer edge 38e of the metal layer 38. On the other hand, the second extending portion 37b of the insulating layer 37 is positioned between the electrode 33 and the outer edge 35e of the metal layer 35 in the Z-direction. The second extending portion 37b is positioned between the electrode 33 and the outer edge 38e of the metal layer 38, in the Z-direction.

The insulating layer 37 includes the surface $37_{S2}$ contacting the outer edge 39e of the metal layer 39, and the surface $37_{S3}$ contacting the surface of the metal layer 38 at the outer edge 38e. The surface $37_{S2}$ is provided at a position adjacent to the surface $37_{S3}$.

In the semiconductor element 3, the distance along the insulating layer 37 from the top surface of the metal layer 38 at the outer edge 38e to the electrode 33 increases, and the interface length from the top surface of the metal layer 38 to the metal layer 35 also increases between the insulating layer 37 and the metal layer 38. Thereby, it is possible to suppress the penetration of the plating solution, and to suppress the corrosive dissolution reaction by delaying the timing of the plating solution contacting the meal layer 35.

Figure 7A:
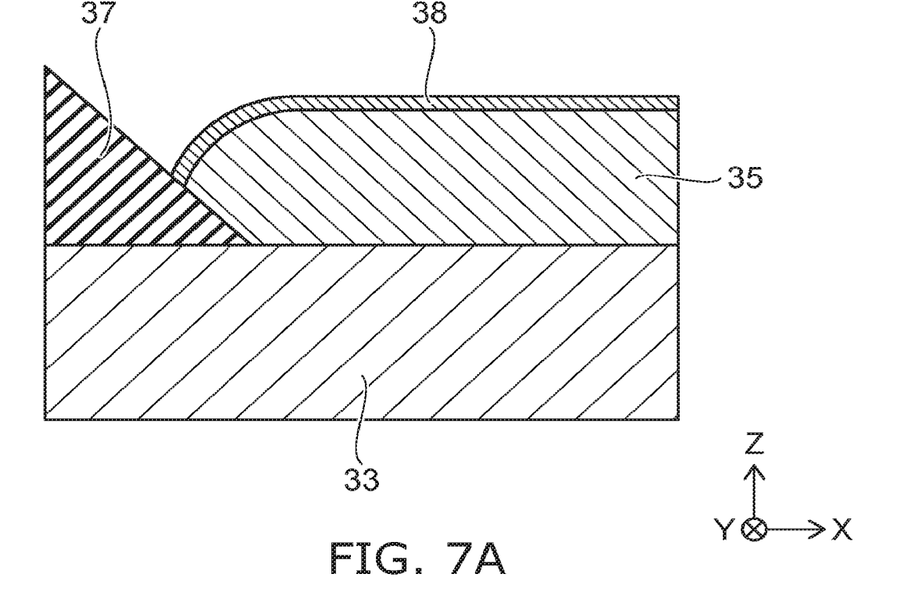
FIGS. 7A and 7B are schematic cross sectional views showing manufacturing processes of the semiconductor element according to a first variation of the embodiment.
Figure 7B:
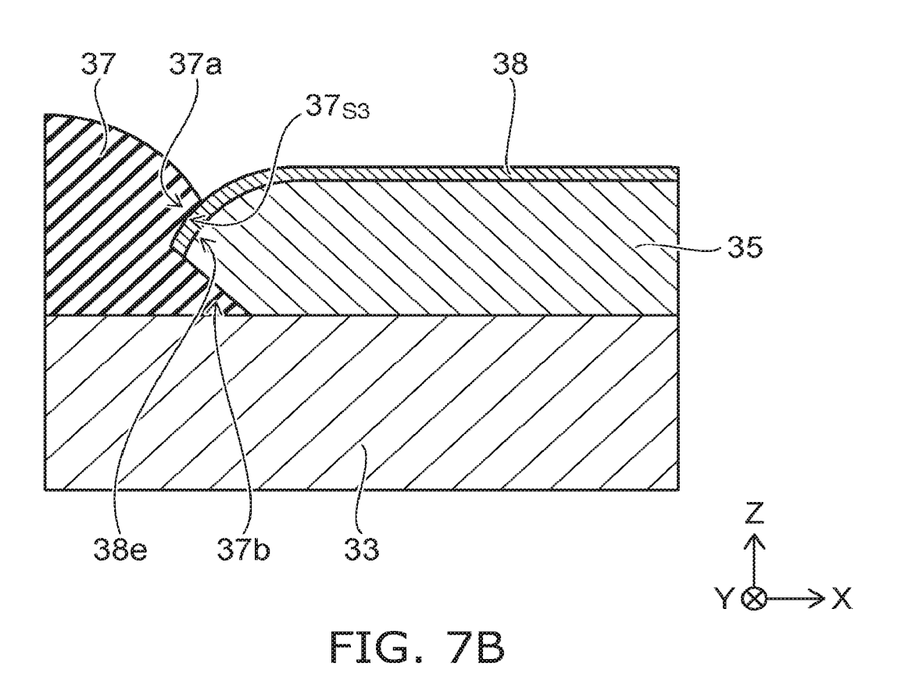

FIGS. 7A and 7B are schematic cross sectional views showing in order the manufacturing processes of the semiconductor element 3 according to the first variation of the embodiment.

As shown in FIG. 7A, the metal layer 35 and the metal layer 38 are selectively formed on the electrode 33 using the insulating layer 37 as a mask. The metal layer 35 and the metal layer 38 are formed, for example, by electroless plating.

As shown in FIG. 7B, the insulating layer 37 is heated to a temperature higher than the glass transition temperature, and is deformed so as to cover the outer edge 38e of the metal layer 38. The insulating layer 37 includes the surface $37_{S3}$ contacting the top surface of the metal layer 38 at the outer edge 38e.

Subsequently, the metal layer 39 is formed on the metal layer 38 (see FIG. 6). The metal layer 39 is selectively formed, for example, by electroless plating using the insulating layer 37 as a mask. The insulating layer 37 includes the surface $37_{S2}$ contacting the outer edge 39e of the metal layer 39.

Figure 8:
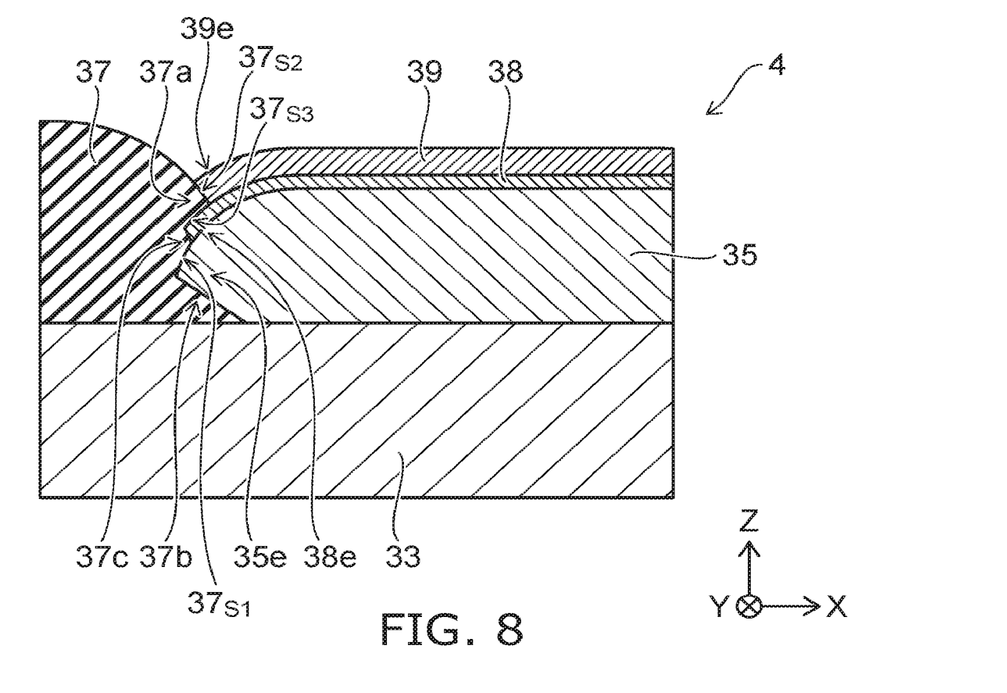
FIG. 8 is a schematic cross sectional view showing an electrode structure of a semiconductor element according to a second variation of the embodiment.

FIG. 8 is a schematic cross sectional view showing an electrode structure of a semiconductor element 4 according to a second variation of the embodiment. In this example, the insulating layer 37 further includes a third extending portion 37c in addition to the first extending portion 37a and the second extending portion 37b. The outer edge 38e of the metal layer 38 and the outer edge 39e of the metal layer 39 are provided respectively with a step shape.

As shown in FIG. 8, the first extending portion 37a is placed between the outer edge 38e of the metal layer 38 and the outer edge 39e of the metal layer 39, in the Z-direction. The second extending portion 37b is placed between the electrode 33 and the outer edge 35e of the metal layer 35, in the Z-direction. The third extending portion 37c is placed between the outer edge 38e of the metal layer 38 and the outer edge 35e of the metal layer 35, in the Z-direction.

The insulating layer 37 includes the surface $37_{S1}$ contacting the top surface of the metal layer 35 at the outer edge 35e, the surface $37_{S2}$ contacting the outer edge 39e of the metal layer 39, and the surface $37_{S3}$ contacting the top surface of the metal layer 38 at the outer edge 38e. The surface $37_{S3}$ is positioned between the surface $37_{S1}$ and the surface $37_{S2}$.

The electrode structure shown in FIG. 8 is formed by a two-step heating treatment. For example, after the metal layer 35 is formed as a first step, the insulating layer 37 is heated to a temperature higher than the glass transition temperature, and is deformed so as to cover the outer edge 35e of the metal layer 35. Moreover, after the metal layer 38 is formed as a second step, the insulating layer 37 is heated again to a temperature higher than the glass transition temperature, and is deformed so as to cover the outer edge 38e of the metal layer 38.

In this manner, it is possible to further increase the distance along the insulating layer 37 from the top surface of the metal layer 38 at the outer edge 38e to the electrode 33 by providing the outer edge 38e of the metal layer 38 and the outer edge 39e of the metal layer 39 with a step shape. The interface from the top surface of the metal layer 38 to the metal layer 35 is also extended between the insulating layer 37 and the metal layer 38. Thereby, it is possible to suppress the penetration of the plating solution, and to suppress the corrosive dissolution reaction of the metal layer 35 by the plating solution.

Figure 9:
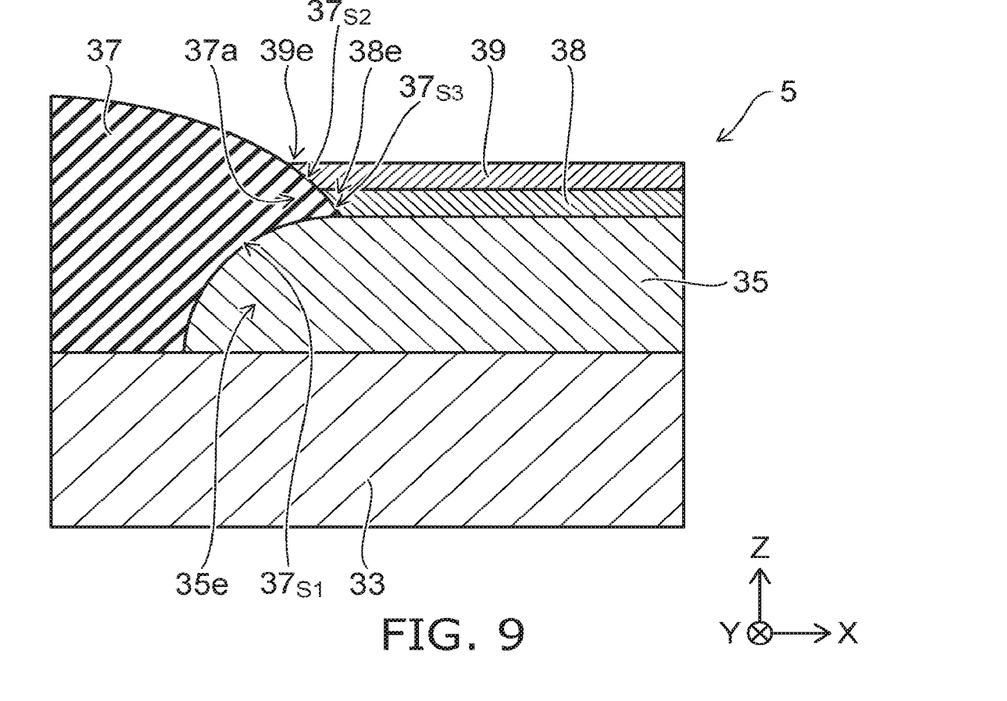
FIG. 9 is a schematic cross sectional view showing an electrode structure of a semiconductor element according to a third variation of the embodiment.

FIG. 9 is a schematic cross sectional view showing an electrode structure of a semiconductor element 5 according to a third variation of the embodiment. In this example, the insulating layer 37 includes the first extending portion 37a covering the outer edge 35e of the metal layer 35, and does not include the second extending portion 37b positioned between the electrode 33 and the outer edge 35e.

As shown in FIG. 9, the first extending portion 37a includes a portion positioned between the metal layer 35 and the outer edge 38e of the metal layer 38, in the Z-direction. The first extending portion 37a includes a portion positioned between the metal layer 35 and the outer edge 39e of the metal layer 39, in the Z-direction.

The insulating layer 37 includes the surface $37_{S1}$ contacting the top surface of the metal layer 35 at the outer edge 35e, the surface $37_{S2}$ contacting the outer edge 39e of the metal layer 39, and the surface $37_{S3}$ contacting the outer edge 38e of the metal layer 38. The surface 37$_{S3}$ is positioned between the surface 37$_{S1}$ and the surface 37$_{S2}$.

Figure 10A:
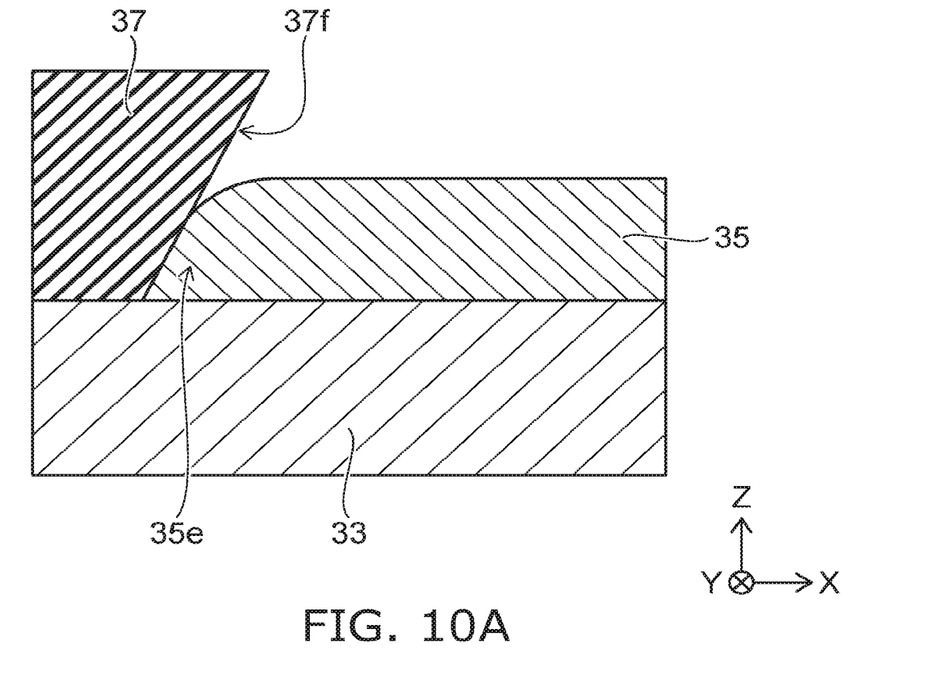
FIGS. 10A and 10B are schematic cross sectional views showing manufacturing processes of the semiconductor element according to the third variation of the embodiment.
Figure 10B:
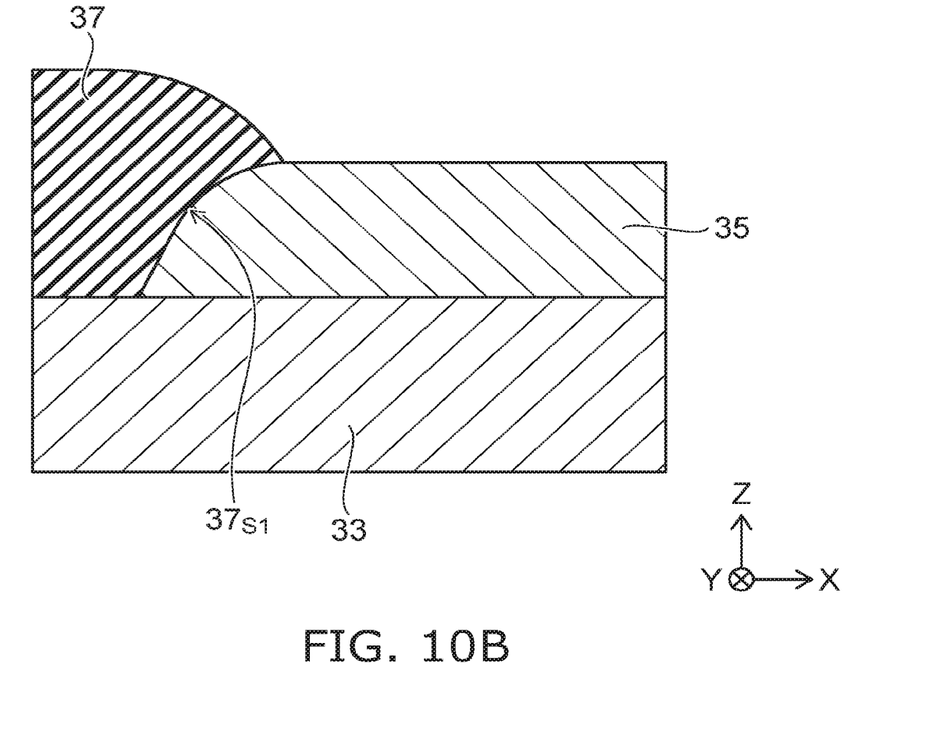

FIGS. 10A and 10B are schematic cross sectional views showing a manufacturing process of the semiconductor element 5 according to the third variation of the embodiment.

As shown in FIG. 10A, after the insulating layer 37 is formed on the electrode 33, the metal layer 35 is selectively formed on the electrode 33. In this example, the insulating layer 37 has the opening 37f with widths in the X-direction and the Y-direction being narrowed upwards from the electrode 33. The opening 37f is formed with a so-called reversed taper shape. The metal layer 35 has the outer edge 35e along the inner wall of the opening 37f.

As shown in FIG. 10B, the insulating layer 37 is heated to a temperature higher than the glass transition temperature, and is deformed so as to cover the outer edge 35e of the metal layer 35. Subsequently, the metal layer 38 and the metal layer 39 are selectively formed, for example, by electroless plating (see FIG. 9). The insulating layer 37 is formed to have the surface 37$_{S1}$ contacting the top surface of the metal layer 35 at the outer edge 35e.

In this manner, it is possible to increase the interface length from the metal layer 38 to the electrode 33 between the metal layer 35 and the insulating layer 37 without providing the second extending portion 37b. In this example, it is possible to increase the interface length between the metal layer 35 and the insulating layer 37 by making the thickness of the insulating layer 37 along the Z-direction thicker than the interface length of the semiconductor element 1 shown in FIG. 2 and the interface length of the semiconductor element 2 shown in FIG. 4. Thereby, it is possible in the semiconductor element 5 to suppress the degradation of electric characteristics and reliability by increasing the penetrating period of plating solution for reaching the electrode 33.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor body;
   an electrode provided on the semiconductor body and electrically connected to the semiconductor body the electrode including first and second portions arranged along the semiconductor body, the second portion surrounding the first portion;
   a first metal layer provided on the first portion of the electrode;
   an insulating layer provided on the second portion of the electrode and surrounding the first metal layer, the insulating layer including a first surface and a second surface adjacent to the first surface, the first surface contacting a top surface of the first metal layer at an outer edge of the first metal layer; and
   a second metal layer provided on the first metal layer, the second metal layer having an outer edge contacting the second surface of the insulating layer.

2. The device according to claim 1, wherein
   the first metal layer is provided on a surface of the electrode, and
   the insulating layer includes an extending portion positioned between the outer edge of the first metal layer and the electrode in a direction perpendicular to the surface of the electrode.

3. The device according to claim 1, wherein the insulating layer includes a portion covering the top surface of the first metal layer at the outer edge of the first metal layer.

4. The device according to claim 1, wherein e outer edge of the second metal layer is provided with a step shape.

5. The device according to claim 1, wherein the first metal layer includes nickel or copper.

6. The device according to claim 1, wherein the second metal layer includes gold.

7. The device according to claim 1, wherein
   the first metal layer is provided on a surface of the electrode, and
   the insulating layer has a thickness along a direction perpendicular to the surface of the electrode, the thickness being thicker than a distance along the direction from the surface of the electrode to a top surface of the second metal layer.

8. The device according to claim 1, further comprising:
   a third metal layer provided between the first metal layer and the second metal layer, wherein
   the insulating layer further includes a third surface positioned between the first surface and the second surface, and
   the third metal layer has an outer edge contacting the third surface of the insulating layer.

9. The device according to claim 8, wherein the third metal layer includes palladium.

10. The device according to claim 8, wherein
    the third surface of the insulating layer contacts a top surface of the third metal layer at an outer edge of the third metal layer.

11. The device according to claim 10, wherein the outer edge of the second metal layer and the outer edge of the third metal layer are provided respectively with a step shape.

12. A semiconductor device, comprising:
    a semiconductor body;
    an electrode provided on the semiconductor body and electrically connected to the semiconductor body, the electrode including first and second portions arranged along the semiconductor body, the second portion surrounding the first portion;
    a first metal layer provided on the first portion of the electrode;
    an insulating layer provided on the second portion of the electrode and surrounding the first metal layer, the insulating layer including an extending portion positioned between the electrode and an outer edge of the first metal layer;
    a second metal layer provided on the first metal layer and having an outer edge contacting the insulating layer; and
    a third metal layer provided between the first metal layer and the second metal layer,
    the insulating layer including a portion covering the outer edge of the first metal layer and an outer edge of the third metal layer, the insulating layer including a surface contacting a top surface of the third metal layer at the outer edge of the third metal layer.

13. The device according to claim 12, wherein the extending portion of the insulating layer is positioned between the electrode and the outer edge of the third metal layer, and contacts the outer edge of the third metal layer.

14. A method for manufacturing a semiconductor device, the method comprising:

forming an insulating layer on a semiconductor body, the insulating layer being provided on an electrode electrically connected to the semiconductor body, the insulating layer having an opening exposing a portion of the electrode, the insulating layer including a material having a glass transition temperature;

forming a first metal layer on the electrode inside the opening of the insulating layer, the first metal layer having a thickness along a direction perpendicular to a surface of the electrode, the thickness of the first metal layer being thinner than a thickness of the insulating layer along the direction;

deforming the insulating layer by heating the insulating layer to a temperature higher than the glass transition temperature, so that the insulating layer includes a portion covering an outer edge of the first metal layer; and forming a second metal layer on an exposed surface of the first metal layer, so that the second metal layer includes an outer edge positioned on the insulating layer.

15. The method according to claim 14, further comprising:

forming a third metal layer on the first metal layer, the second metal layer being formed on the third metal layer.

16. The method according to claim 15, wherein the third metal layer is formed after the insulating layer is heated to a temperature higher than the glass transition temperature.

17. The method according to claim 15, wherein the insulating layer is heated to a temperature higher than the glass transition temperature after the third metal layer is formed on the first metal layer.

\* \* \* \* \*